United States Patent
Albinet

(10) Patent No.: US 10,763,887 B2
(45) Date of Patent: Sep. 1, 2020

(54) SIGMA DELTA ANALOG TO DIGITAL CONVERTER

(71) Applicant: NXP B.V., Eindhoven (NL)

(72) Inventor: Xavier Albinet, Roquefort les Pins (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/672,985

(22) Filed: Nov. 4, 2019

(65) Prior Publication Data

US 2020/0169267 A1 May 28, 2020

(30) Foreign Application Priority Data

Nov. 26, 2018  (EP) ..................... 18306571

(51) Int. Cl.
  *H03M 3/00* (2006.01)
  *H03F 3/183* (2006.01)
  *H03G 3/00* (2006.01)
  *H03M 1/18* (2006.01)

(52) U.S. Cl.
  CPC .............. *H03M 3/39* (2013.01); *H03F 3/183* (2013.01); *H03G 3/001* (2013.01); *H03M 1/18* (2013.01); *H03M 1/183* (2013.01); *H03M 3/37* (2013.01); *H03F 2200/03* (2013.01)

(58) Field of Classification Search
  CPC ............ H03M 3/39; H03M 3/37; H03M 1/18; H03M 1/183; H03G 3/001; H03F 3/183; H03F 2200/03
  USPC ......................................... 341/139, 143, 155
  See application file for complete search history.

(56) References Cited

U.S. PATENT DOCUMENTS

| | | | |
|---|---|---|---|
| 6,445,320 B1 | 9/2002 | Noro et al. | |
| 6,958,648 B2 | 10/2005 | Cheung et al. | |
| 6,975,259 B1 | 12/2005 | Jensen | |
| 7,148,829 B2 * | 12/2006 | Inukai ................... | H03M 3/492 341/139 |
| 7,365,664 B2 | 4/2008 | Caduff | |
| 2009/0161888 A1 | 6/2009 | Okada | |

* cited by examiner

*Primary Examiner* — Khai M Nguyen

(57) ABSTRACT

A Sigma-Delta analog to digital converter (ADC) is described. The Sigma-Delta ADC includes a series arrangement of a gain tracker, a first discrete-time integrator stage and a quantizer between an ADC input and an ADC output. The Sigma-Delta ADC includes a digital to analog converter (DAC) having a DAC input and a DAC output connected to the gain tracker. The Sigma-Delta analog to digital converter includes a controller having a control input connected to the quantizer output. The controller provides a digital input to the DAC input and provides a gain control signal to the gain tracker.

15 Claims, 6 Drawing Sheets

150

150

200

SIGMA DELTA ANALOG TO DIGITAL CONVERTER

CROSS-REFERENCE TO RELATED APPLICATIONS

This application claims the priority under 35 U.S.C. § 119 of European patent application no. 18306571.3, filed Nov. 26, 2018 the contents of which are incorporated by reference herein.

FIELD

This disclosure relates to Sigma-Delta analog to digital converters (ADC).

BACKGROUND

Sigma-delta (ΣΔ) analog to digital converters, also referred to as Delta-Sigma analog to digital converters are widely used in audio applications such as smart amplifier, digital and analog microphones, power integrated circuits and instrumentation. Such applications may require high dynamic range to adapt to significant differences in input signal level. High gain may be needed for a small input voltage whereas for larger voltages, the gain must be reduced to avoid saturation of the ADC. To overcome this a programmable gain amplifier (PGA) may be used before the input of the ADC to vary the gain.

SUMMARY

Various aspects of the disclosure are defined in the accompanying claims. In a first aspect there is provided Sigma-Delta analog to digital converter (ADC) comprising a series arrangement of a gain tracker, a first discrete-time integrator stage and a quantizer between an ADC input and an ADC output; a digital to analog converter (DAC) having a DAC input and a DAC output connected to the gain tracker; and a controller having a control input coupled to the quantizer output; wherein the controller is configured to provide a digital input to the DAC input and to provide a gain control signal to the gain tracker wherein the gain tracker is configured to apply a gain determined by the gain control output to a signal corresponding to a difference between a received signal on the analog input and the quantizer output.

In one or more embodiments, the gain tracker may comprise a differential amplifier having a first differential amplifier input coupled to the ADC input, a second differential amplifier input configured to be coupled to a supply voltage, and a differential amplifier output; and configured to amplify the difference of the analog input signal and the ADC output signal; wherein the DAC output is connected to the first differential amplifier input.

In one or more embodiments, the DAC may comprise a programmable current source.

In one or more embodiments, the DAC may comprise a first DAC variable resistance arranged between a reference voltage terminal and the DAC output; a second DAC variable resistance arranged between a ground reference terminal and the DAC output; wherein the first variable resistance and second variable resistance are coupled to the DAC data output.

In one or more embodiments, the gain tracker circuit may further comprise a first gain tracking resistance arranged between the ADC input and the first differential amplifier input and a second gain tracking resistance arranged between the differential amplifier output and the first differential amplifier input and wherein at least one of the first gain tracking resistance and the second gain tracking resistance is a variable resistance and is coupled to the gain control output.

In one or more embodiments, the Sigma-Delta ADC may further comprise a sinc filter arranged between the ADC output and the controller wherein the sinc filter is configured to scale the output to a predetermined number of levels.

In one or more embodiments, the controller may be configured to determine the gain value on the gain output by comparing the magnitude of the scaled output of the sinc filter with a predetermined threshold for a predetermined time.

In one or more embodiments, the first integrator stage may be a passive integrator and the ADC further comprises a phase corrector arranged between the output of the integrator and the first differential input and wherein the gain control output is coupled to the phase corrector.

In one or more embodiments, the gain tracking circuit may comprise a variable phase corrector resistance arranged between the phase corrector output and the first differential input wherein the gain control output is coupled to the phase corrector resistance.

In one or more embodiments, the controller may be configured to determine a first gain control value on the gain output by comparing the magnitude of the scaled output of the sinc filter with a predetermined threshold for a predetermined time and to determine a second gain control value from the first gain value and the gain of the passive integrator and wherein the first gain value is used to control the first gain tracking resistance and the second gain control value is used to control the phase corrector resistance.

In one or more embodiments, the Sigma-Delta ADC may further comprise a series arrangement of a second differentiator stage and second integrator coupled between the first integrator output and the quantizer input, wherein the quantizer output is coupled to a first input of the second differentiator stage.

In one or more embodiments, the Sigma-Delta ADC may further comprise a first gain stage arranged between the first integrator output and a second input of the second differentiator stage, a second gain stage arranged between the second integrator output and a first input of the second differentiator stage, a third gain stage arranged between the quantizer output and the first input of the differentiator stage.

In one or more embodiments, the gain control output may be coupled to the first gain stage.

In one or more embodiments, the first gain stage may have a gain factor of B/A, the second gain stage has a gain factor of 1/B and the third gain stage has a gain factor of −2/B wherein A is the variable gain of the first differentiator stage.

One or more embodiments of the Sigma-Delta ADC may be included in an audio apparatus, an RF apparatus, and a baseband system.

BRIEF DESCRIPTION OF THE DRAWINGS

In the figures and description like reference numerals refer to like features. Embodiments of are now described in detail, by way of example only, illustrated by the accompanying drawings in which.

DETAILED DESCRIPTION OF EMBODIMENTS

Figure 1:
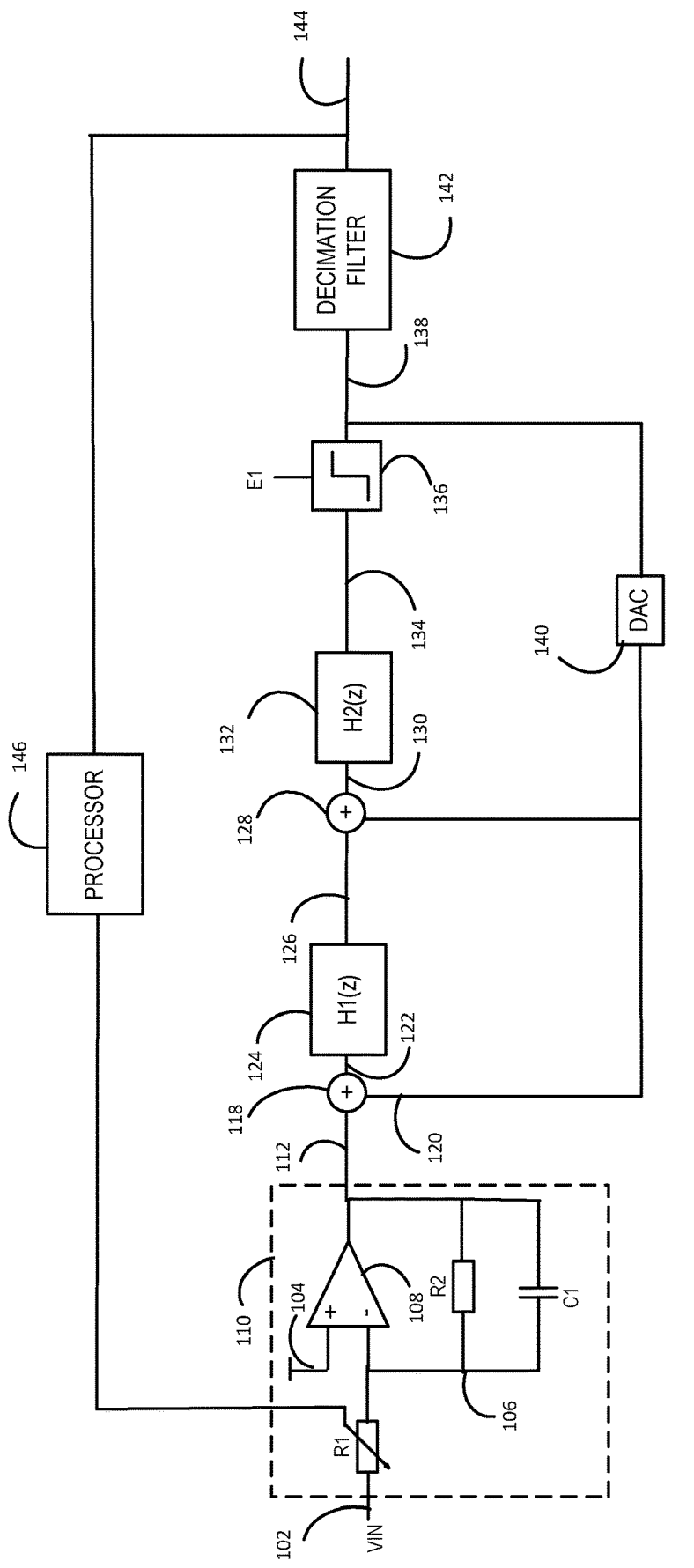
FIG. 1 shows an example second order Sigma-Delta ADC and a programmable gain amplifier.

FIG. 1 shows a typical second order Sigma Delta analog to digital convertor (ADC) 100. Sigma Delta ADC 100 includes a first differentiator stage 118, a first integrator 124, a second differentiator stage 128, a second integrator 132, a quantiser 136, and a digital to analog converter 140. A programmable gain amplifier (PGA) 110 may have an analog input 102 and an analog output 112 connected to a first input of the first differentiator stage 118. A second input of the first differentiator stage 118 may be connected to an output 120 of a digital to analog converter 140. An output 122 of the first differentiator stage 118 may be connected to an input of the first integrator 124. A first integrator output 126 may be connected to a first input of the second differentiator stage 128. A second input of the second differential stage 128 may be connected to the DAC output 120. A second differential stage output 130 may be connected to the second integrator 132. A second integrator output 134 may be connected to an input of the quantiser 136. A quantiser output 138 may be connected to a decimation filter 142. The quantiser output 138 may be connected to an input of the DAC 140. An output of the decimation filter 142 may be connected to the ADC output 144. The ADC output 144 may be connected to a processor 146. An output of the processor 146 may be connected to a control terminal of variable resistance R1. It will be appreciated that in some examples, variable resistances may be implemented as an arrangement of switchable resistances of different fixed values.

The programmable gain amplifier 110 may include the first variable resistance R1 having a first terminal connected to the programmable gain amplifier input 102 and a second terminal connected to the inverting input 106 of a differential amplifier 108. A second resistance R2 may have a first terminal connected to the inverting input 106 and a second terminal connected to the amplifier output 112. A capacitance C1 may have a first terminal connected to the inverting input 106 and a second terminal connected to the amplifier output 112. Capacitor C1 may remove high frequency content from input (Vin).

The noninverting input 104 of the differential amplifier 108 may be connected to the supply rail.

In operation, an analog input received on the programmable gain amplifier input 102 may be amplified and output to the first input of the first differentiator stage 118. The difference between the analog signal received at the first input of the first differentiator stage 118 and the analog signal received at the second input of the first differentiator stage 118 is integrated by the first integrator 124 which also oversamples the signal. Similarly, the second differentiator stage 128 outputs the difference between the output of the first integrator 124 and the DAC output 120 which is then integrated by the second integrator 132. The output of the second integrator is quantised by the quantiser 136 with quantisation error E1. The output of the quantiser is a pulse density modulated (PDM) bitstream which is then supplied to the decimation filter 142 which further filters the signal to generate a digital signal corresponding to the analog input signal. This digital signal may be coupled to the processor 146. The processor 146 may adjust the gain of the programmable gain amplifier 110 to track the analog input signal by varying the resistance of R1 to improve the dynamic range of the Sigma Delta ADC 100.

The processor 146 may vary the gain by increasing the gain for a relatively small input voltage and reducing the gain if the input voltages large to avoid saturation of the Sigma Delta ADC 100. This may improve the dynamic range as may be understood by considering an ideal version of the programmable gain amplifier having two gain settings, a gain of one and a gain of two. In this case the dynamic range of the system is increased by 6 dB. If the least significant bit (LSB) of an ADC is equivalent to 10 mV of input voltage, the Sigma-Delta ADC 100 cannot resolve signals smaller than 10 mV. However, when the gain of PGA 110 is increased to two, input signals of 5 mV may be resolved.

In order to determine which gain value is required for the PGA 110, the processor 146 may combine gain information with the digital output from the Sigma Delta ADC 100. This gain change may be non-optimal due to the delay in determining a change in the signal level because the processor 146 uses the digital output 144 which has some delay compared to the input signal. Furthermore, switching between the gain values may cause some glitches on the digital output signals. One solution to this uses two parallel amplifiers with different gain settings connected to two ADC's. Control software running on a processor is used to determine which ADC path may be used to achieve better signal to noise ratio (SNR).

The Sigma-Delta ADC 100 is a second order Sigma-Delta modulation ADC. Depending on the required resolution, a first order Sigma-Delta converter may be used having one differentiator stage and one integrator. Alternatively, higher-order Sigma-Delta ADC's may use three or more differential integration stages.

Figure 2:
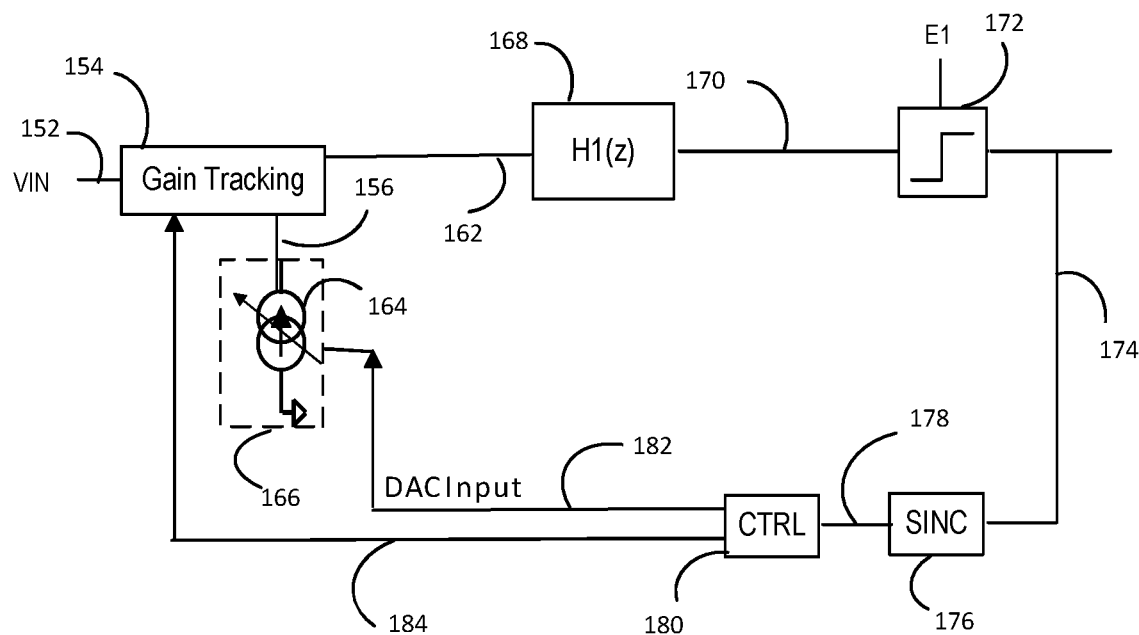
FIG. 2 illustrates a first order Sigma-Delta ADC according to an embodiment.

FIG. 2 shows a first order Sigma-Delta ADC 150 according to an embodiment. Sigma-Delta ADC 150 may include a first differential stage including a gain tracker 154 which may include a programmable gain amplifier. The Sigma Delta ADC 150 may also include a digital to analog converter 166, an integrator 168, a quantiser 172, a digital SINC (sin(x)/x) filter 176, and a controller 180. An ADC input 152 may be connected to an input of the gain tracker 154. A first control output 184 of the controller 180 may be connected to a control input of the gain tracker 154. A second control output 182 of the controller 180 may be connected to a control input of the DAC 166. The DAC 166 may include a programmable current source 164 having an output 156 connected to the gain tracker 154. The programmable current source 164 may be controlled by the second control output 182 of the controller 180.

The gain tracker output 162 may be connected to an input of the integrator 168. The integrator output 170 may be connected to an input of the quantiser 172. The quantiser output 174 may be connected to an input of the SINC filter 176. The SINC filter output 178 may be connected to an input of the controller 180.

In operation, the controller 180 may receive a clock which may be the first phase of a two phase non-overlapping clock and generates a DAC input value determined from an output of the SINC filter 176. The DAC input value used to control the voltage to current converter 164 to generate a current corresponding to the digital DAC input data. The controller 180 may also generate a control signal on first control output 184 for the gain tracker 154 to alter the gain applied to an input signal on the ADC input 152. The gain tracker 154 may generate a signal corresponding to the difference of the input signal with a gain applied and the signal at the quantizer output 174.

The output of the gain tracker may be sampled by a clock which may be the first phase of a two phase non-overlapping clock (not shown) and integrated by the integrator 168. The output of the integrator 168 is quantised by the quantiser 172 with quantisation error E1. The output of the quantiser is a pulse density modulated (PDM) bitstream which is then supplied to a decimation filter (not shown) and further filtering to generate a digital signal corresponding to the analog input signal.

The inventor of the present disclosure has appreciated that by providing the DAC output to the gain tracker, the glitches on the digital output may be reduced because the gain update is provided using the same clock or clock phase used to supply the integrator 168. Furthermore the gain is controlled based on the PDM output of the Sigma-Delta ADC 150 rather than the final digital output after the decimation filtering. This may result in a faster response to adjust the gain in response to changes in the amplitude of the analog input signal.

The SINC filter 176 may act as a low pass filter and reduce the quantization noise and consequently the output swing of the integrator 168. It will be appreciated that in other examples, other low-pass filters may be used. The SINC filter 176 may scale the output of the PDM signal with N+1 discrete levels.

Figure 3A:
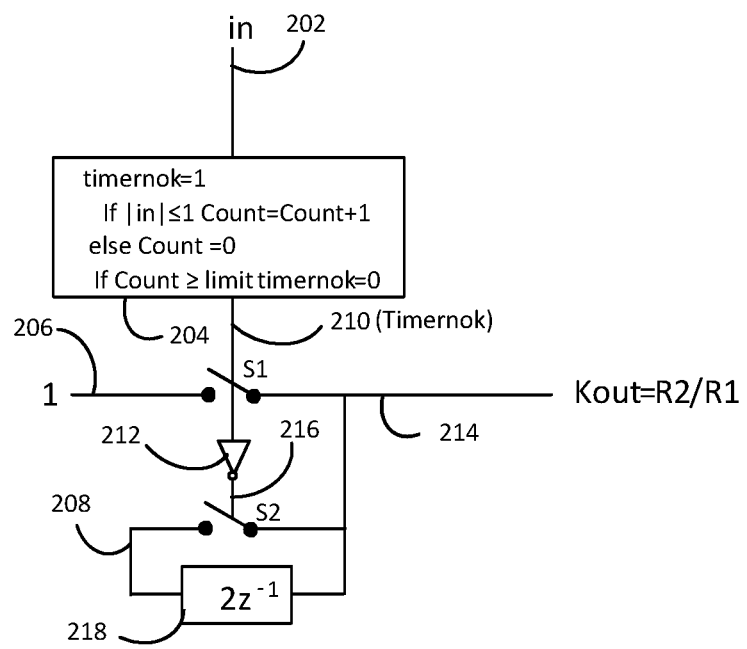
FIG. 3A shows an example controller for the Sigma-Delta ADC of FIG. 2.

FIG. 3A shows an example controller 200 which may be used to implement gain control in the controller 180 of the Sigma Delta ADC 150. The controller 200 may have an input 202 connected to a timer module 204. The timer module 204 may have a timer module output 210 which may be connected to a control input of a first switch S1. The first switch S1 may have a first switch first terminal 206 connected to a reference voltage supply rail representing a logical high value. A first switch second terminal may be connected to the gain control output 214. The timer module output 210 may be connected to an input of an inverter 212. An inverter output 216 may be connected to a control input of second switch S2. A first terminal 208 of second switch S2 may be connected to an output of a delay element 218. A second terminal of second switch S2 may be connected to the gain output 214.

Figure 3B:
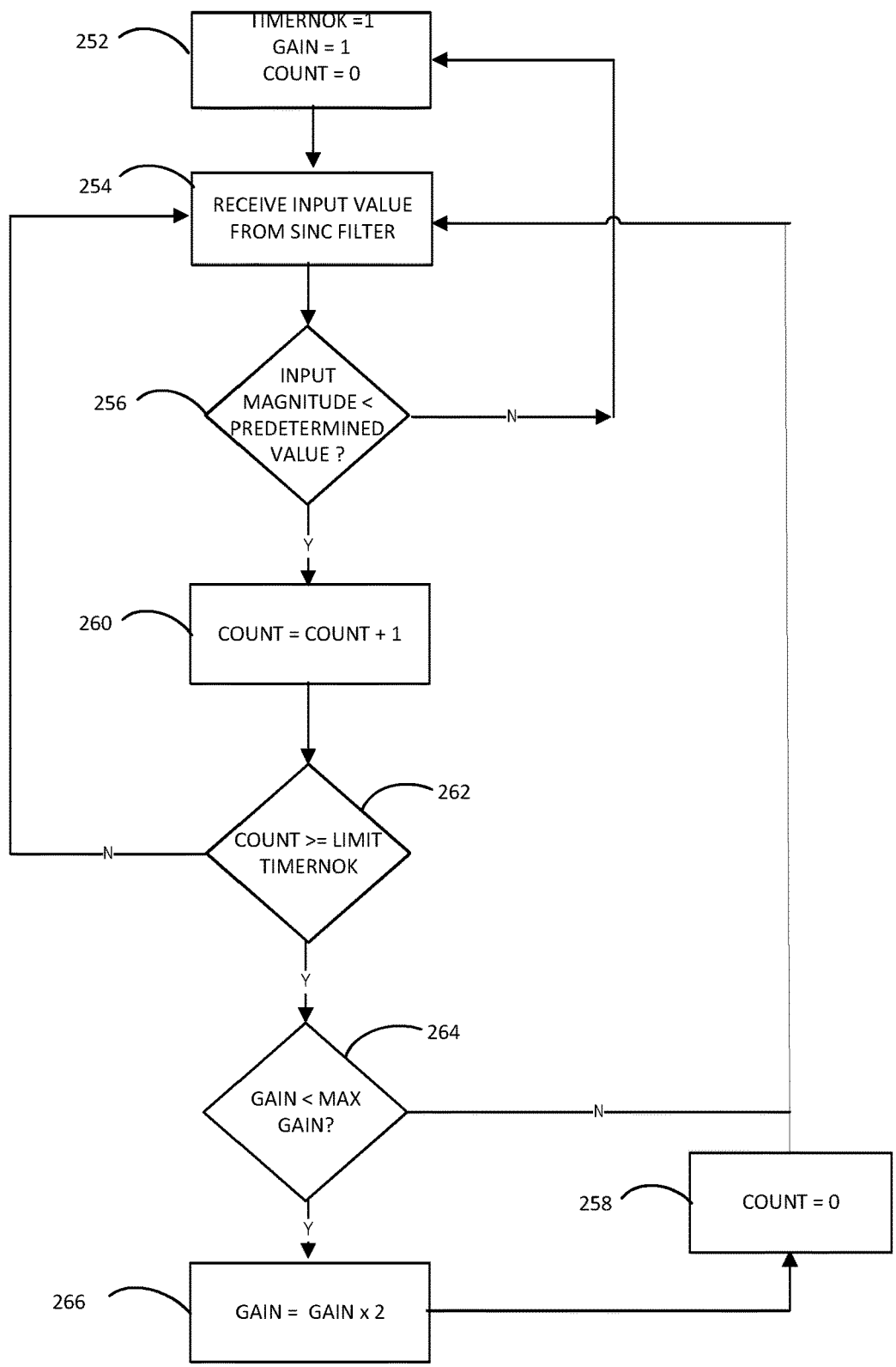
FIG. 3B shows a flow diagram of the operation of the controller of FIG. 3A.

A method of operation 250 of the controller 200 to increase the gain value is illustrated in FIG. 3B. In step 252, the timer module output 210 denoted TIMERNOK is set to logic 1 which closes the switch s1 setting the gain to unity. A counter in the timer control module 204 may also have a count value set to 0. In step 254 an input value may be received from the SINC filter on the input 202. In step 256, the timer module 204 may compare the magnitude of the input signal with a predetermined gain value. If the magnitude of the input signal is greater than the predetermined gain value, the method then returns to step 252. If the magnitude of the input signal is less than the predetermined gain value, the timer module 204 may increment a counter in step 260. In step 262, the timer module 204 compares the counter value with a time duration defined by a timer limit value denoted "LIMIT TIMERNOK". If the counter value is less than the timer limit value, the method returns to step 254. Otherwise in step 264 the timer module 204 may compare the current gain value to a predetermined maximum gain value. If the current gain value is less than the maximum gain value, the timer module may de-assert the TIMERNOK signal which results in switch s2 closing. The delay element 218 may shift the current gain value, effectively multiplying the gain value by two in step 266. The method then returns to step 258 and the timer module 204 resets the counter to zero. Returning to step 264, if the current gain value is the maximum gain value, the method returns to step 254.

Figure 4A:
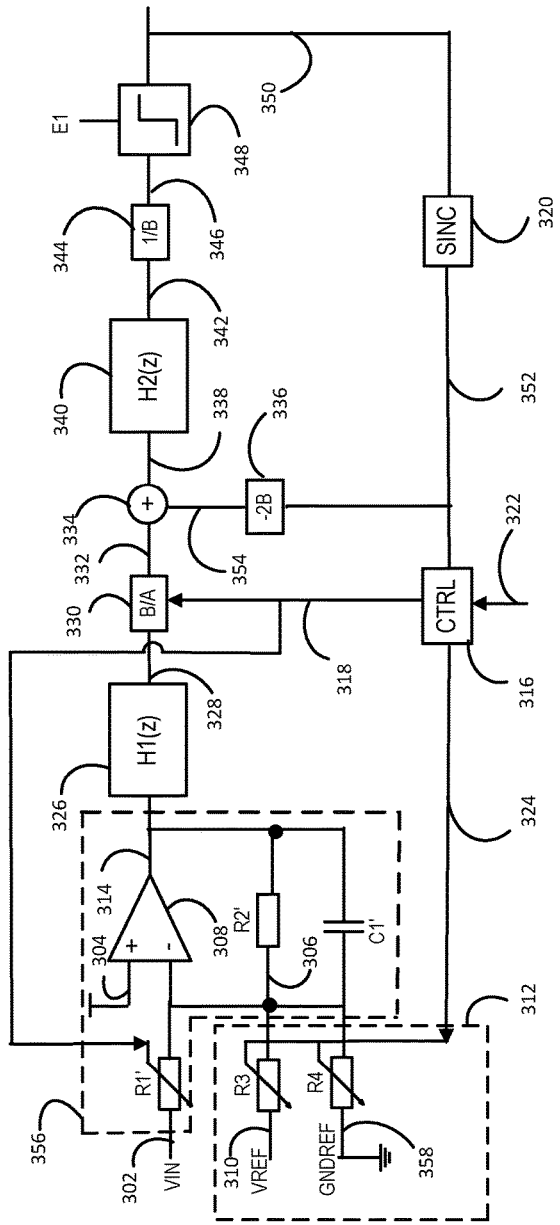
FIG. 4A illustrates a second order Sigma-Delta ADC including an active integrator according to an embodiment.

FIG. 4A shows a second-order Sigma-Delta analog to digital converter 300. Sigma-delta ADC 300 may include a first differentiator stage including a gain tracker 356 having a variable resistance R1', and a differential amplifier 308. An ADC input 302 may be connected to a first terminal of variable resistance R1'. A second terminal of variable resistance R1' may be connected to inverting input 306 of the differential amplifier 308. An output 314 of the differential amplifier 308 may be connected to a first terminal of feedback resistance R2'. A second terminal of feedback resistance R2' may be connected to inverting input 306. A first control output 318 of the controller 316 may be connected to a control terminal of the variable resistance R1'. A digital to analog converter (DAC) 312 may include a first DAC variable resistance R3 and a second DAC variable resistance R4. A first terminal of the first DAC variable resistance R3 may be connected to a reference supply rail 310. A second terminal of the first DAC variable resistance R3 may be connected to inverting input 306. A first terminal of the second DAC variable resistance R4 may be connected to a reference ground rail 358. A second terminal of the second DAC variable resistance R4 may be connected to inverting input 306. A second control output 324 of the controller 316 may be connected to a control input of the first DAC variable resistance R3 and the second DAC variable resistance R4. A capacitance C1' may have a first terminal connected to the differential amplifier output which may be connected to gain tracker output 314. The capacitance C1' may have a second terminal connected to the inverting input 306. A noninverting input 304 of the differential amplifier 308 may be connected to a supply rail. Capacitor C1' may remove high frequency content from input (Vin) and high frequency quantization noise from ADC output via DAC feedback path.

The differential amplifier output 314 may be connected to an input of a first integrator 326. The integrator 326 may be an active integrator having a transfer function expressed as $z^{-1}/(1-z^{-1})$. The first integrator output 328 may be connected to an input of a first gain element 330. An output 332 of the first gain element may be connected to a first input of second differentiator 334. A second input of second differentiator 334 may be connected to an output 354 of a second gain element 336. An output 338 of the second differentiator 334 may be connected to an input of the second integrator 340. An output 342 of the second integrator 340 may be connected to an input of a third gain element 344. A third gain element output 346 may be connected to an input of a quantizer 348.

The quantizer output 350 may be connected to an input of the SINC filter 320. The SINC filter output 352 may be connected to a second input of the second gain element 336. The SINC filter output 352 may be connected to a first input of the controller 316. A second input 322 of the controller which may be a register interface for updating maximum gain values may be connected to a microprocessor (not shown). In other examples, the maximum gain values may be hardwired in which case the second input 322 may not be required.

The gain tracker 356 may apply a gain to the difference between the input signal voltage VIN and the analog equivalent of the DAC input value on the second control output 324.

The gain tracker output 314 is oversampled and integrated by the first integrator 326. The second differentiator stage outputs the difference between the output of the first integrator 326 and the quantizer output 350 with a gain of factor −2 B, where B is an arbitrary gain value, which is then integrated by the second integrator 340. The output of the second integrator 340 has a gain factor of 1/B applied by third gain element 344 and the output signal from the third gain element 344 is quantised by the quantiser 348 with quantisation error E1. The output of the quantiser is a pulse density modulated (PDM) bitstream which is then supplied to a decimation filter (not shown) and further filtering to generate a digital signal corresponding to the analog input signal.

The controller 316 generates a DAC input value on the second control output 324 determined from an output of the SINC filter which is used to control the variable resistances R3 and R4 to generate a current corresponding to the digital DAC input data. The controller 316 may also generate a control signal on the first control output for the gain tracker 356 to alter the gain applied to an input signal on the ADC input 302. The controller may alter the gain of the gain tracker 356 by selecting a value of resistance R1' corresponding to R2'/A where A is the desired gain.

The controller gain control may be implemented as for controller 200 where the desired gain A of the first differentiator stage corresponds to the value of Kout of controller 200. The maximum gain value may be provided to the controller 316 via the register interface 322 and stored in a register (not shown) in the controller 316. The controller 316 may also control the gain of the first gain element by a factor of B/A. By varying the gain of the first gain element 330 by a factor of B/A, the same signal and noise transfer function is maintained regardless of the gain of the first differentiator stage. The second gain element 336 may have a gain factor of −2 B. The third gain element 344 may have a factor of 1/B where A and B are desired gain values.

Figure 4B:
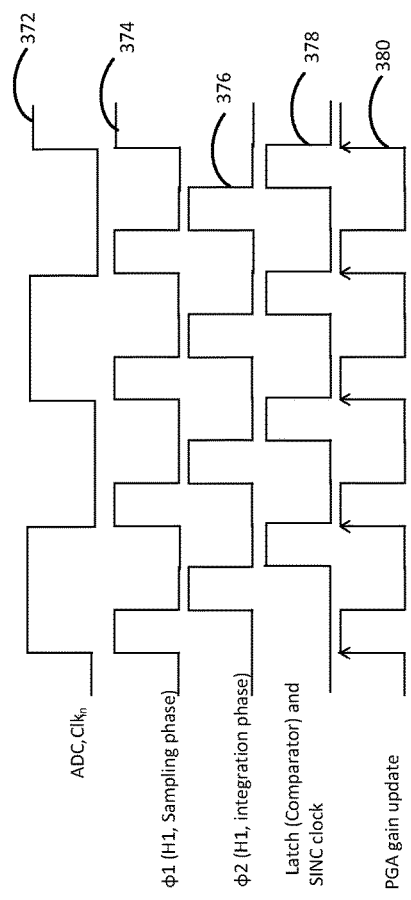
FIG. 4B illustrates an example clock generation scheme for the Sigma-Delta ADC of FIG. 4A.

Example generated clock waveforms 370 for the Sigma-Delta ADC 300 are shown in FIG. 4B. Waveform 372 shows the ADC master clock. Line 374 shows clock $\phi 1$ corresponding to a first phase of a two-phase non-overlapping clock which is provided to the first integrator 326 for sampling the input signal. Line 376 shows clock $\phi 2$ corresponding to a second phase of a two-phase non-overlapping clock which may be provided to control the integration phase of the first integrator 326. Line 378 shows the clock derived for the SINC filter 320 which is generated during the non-overlapping time of clock $\phi 1$ and clock $\phi 2$. Line 380 shows the clock derived for the controller filter 322 which corresponds to clock $\phi 1$ shown in line 374.

The inventor of the present disclosure has appreciated that the glitches on the digital output may be reduced by providing the gain update using the same clock used to sample the signal to the first integrator 326, the first gain element 330, and the second integrator 340. Furthermore the gain is controlled based on the PDM output of the Sigma-Delta ADC 300 rather than the final digital output after the decimation filtering. This may result in a more rapid response to changes in the input signal than in other analog to digital converters.

The SINC filter 320 may reduce the output swing of the first integrator 326 and the second integrator 340. The SINC filter 320 may scale the output of the PDM signal with N+1 discrete levels. The maximum value of desired gain A, denoted as $Kout_{max}$ may be (N−1)/2 to avoid saturation of the ADC 300. For instance, if SINC filter 320 has 33 levels, then $Kout_{max}$=16. In this example Kout may be a value of 1, 2, 4, 8 or 16 if the gain controller 200 is used in controller 316.

Figure 5:
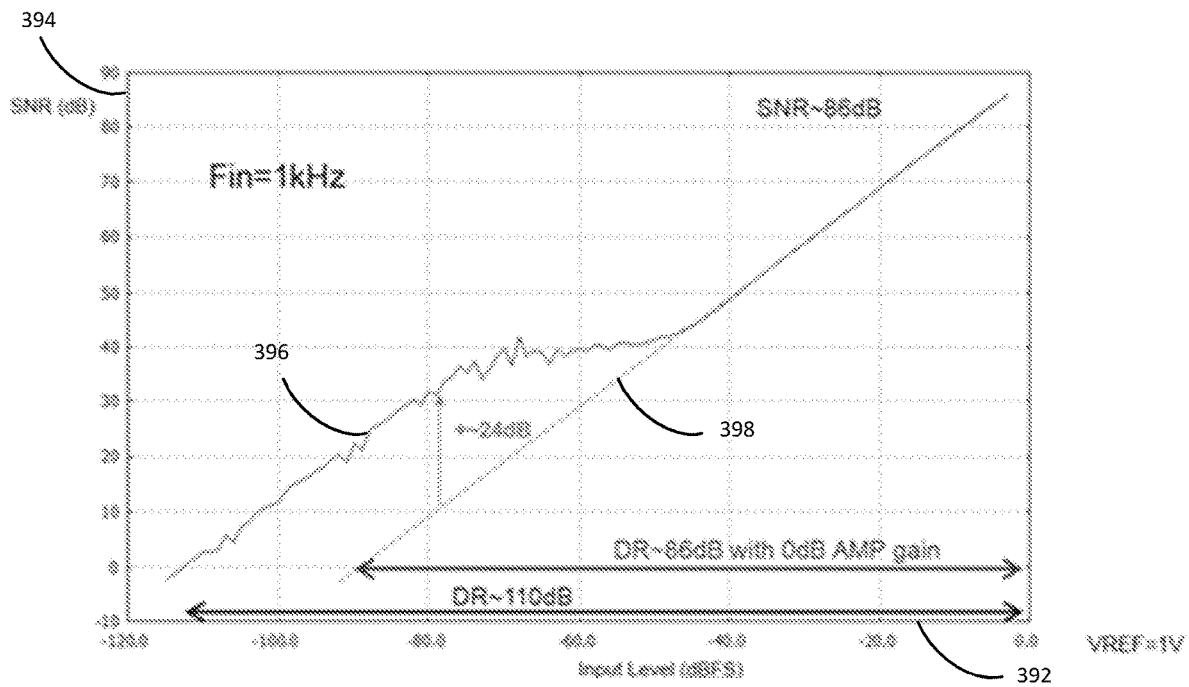
FIG. 5 shows illustrates the signal to noise ratio (SNR) vs amplitude of the second order Sigma-Delta ADC of FIG. 4A

FIG. 5 illustrates a graph 390 showing the improved dynamic range of the Sigma-Delta ADC 300. The x-axis 392 shows the input level ranging from −120 dbFS to 0 dbFS for a reference voltage level of 1 volt. The y-axis 394 shows the signal to noise ration varying from −10 to +90 db. Line 396 shows the signal to noise ratio (SNR) variation for the Sigma-Delta ADC 300 as the gain is varied from 0 dB at input levels greater than −50 dB to 24 dB. Line 398 shows the variation of SNR with input signal for a 0 dB gain amplifier. By varying the gain of the first differentiator stage between 0 dB and 24 dB, the dynamic range may be increased from approximately 86 dB to 110 dB.

Figure 6A:
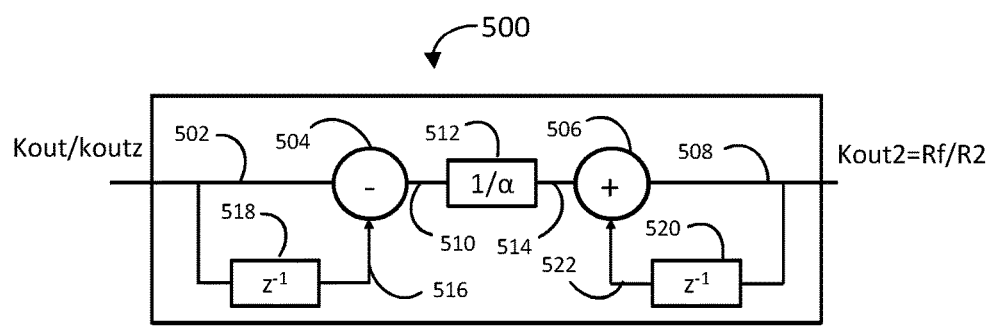
FIG. 6A illustrates an example controller for the Sigma-Delta ADC of FIG. 6B.
Figure 6B:
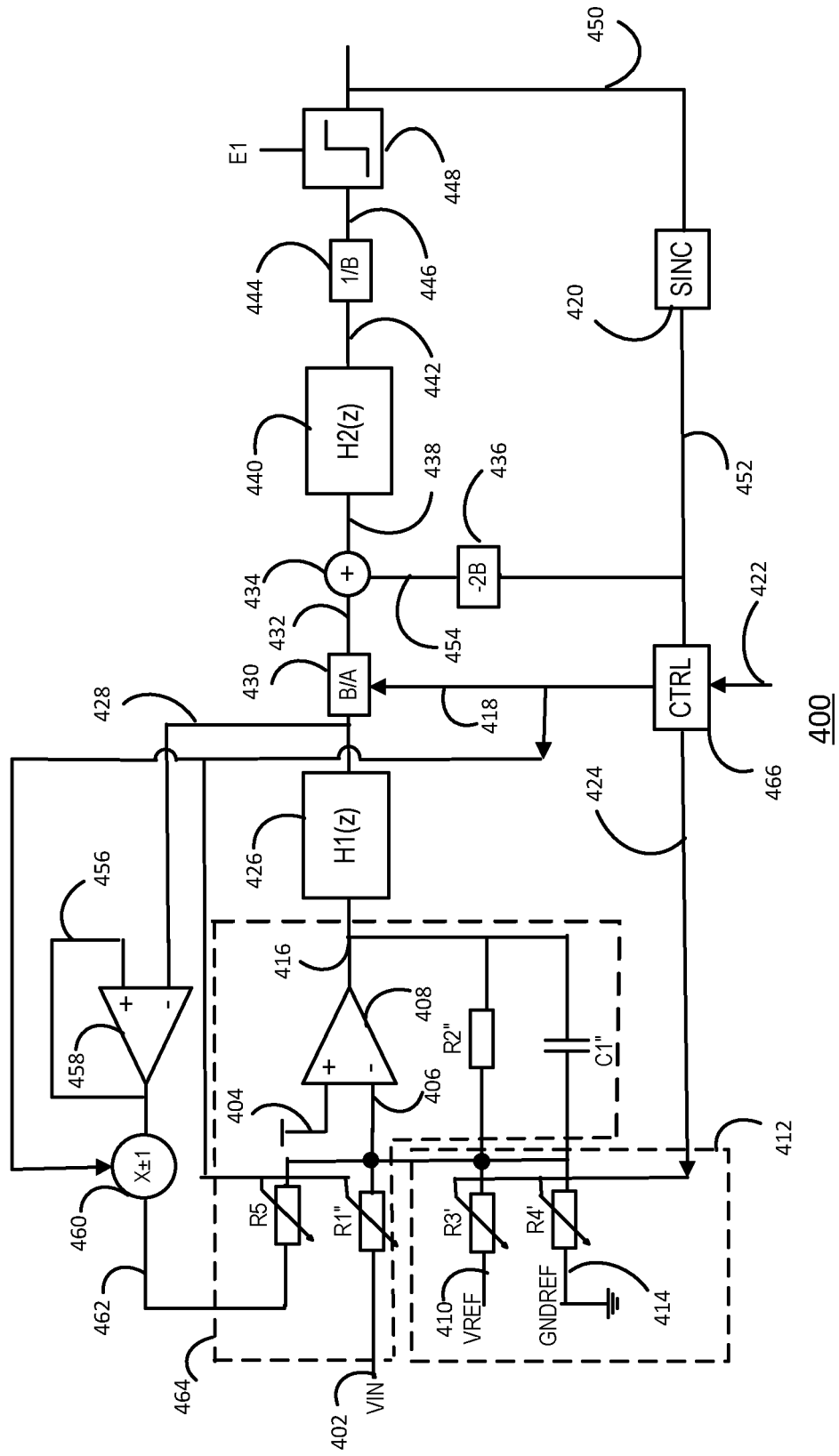
FIG. 6B illustrates a second order Sigma-Delta ADC including a passive integrator according to an embodiment.

FIG. 6A shows an example of a gain controller 500 for use in a second order Sigma-Delta modulator 400 illustrated in FIG. 6B which uses a passive integrator in the first stage.

Sigma-delta ADC 400 may have a first differentiator stage including a gain tracker 464 having a variable resistance R1" and phase corrector resistance R5, a differential amplifier 408, a resistance R2" which may be fixed or variable and capacitance C1". An ADC input 402 may be connected to a first terminal of variable resistance R1". A second terminal of variable resistance R1" may be connected to inverting input 406 of the differential amplifier 408. An output of the differential amplifier 408 may be connected to a first terminal of feedback resistance R2". A second terminal of feedback resistance R2" may be connected to inverting input 406. A first control output 418 of the controller 466 may be connected to a control terminal of the variable resistance R1". The first control output 418 of the controller 466 may be connected to a control terminal of the phase corrector resistance R5. The first control output 418 of the controller 466 may be connected to a control terminal of the polarity inverter 460.

The DAC 412 may include a first DAC variable resistance R3' and a second DAC variable resistance R4'. A first terminal of the first DAC variable resistance R3' may be connected to a reference supply rail 410. A second terminal of the first DAC variable resistance R3' may be connected to inverting input 406. A first terminal of the second DAC variable resistance R4' may be connected to a reference ground rail 414. A second terminal of the second DAC variable resistance R4' may be connected to inverting input 406. A second control output 424 of the controller 466 may be connected to a control input of the first DAC variable resistance R3' and the second DAC variable resistance R4'. A capacitance C1" may have a first terminal connected to the differential amplifier output which may be connected to the gain tracker output 416. The capacitance C1" may have a second terminal connected to the inverting input 406. A noninverting input 404 of the differential amplifier 408 may be connected to a supply rail. Capacitor C1" may remove high frequency content from input (Vin) and high frequency quantization noise from ADC output via DAC feedback path.

The gain tracker output 416 may be connected to an input of a first integrator 426 which is a passive integrator. The passive integrator may have a transfer function expressed as $\alpha z^{-1}/(1-(1-\alpha)z^{-1})$ where $\alpha$ is the passive integrator gain.

The first integrator output 428 may be connected to an input of a first gain element 430. The first integrator output 428 may be connected to the inverting input of a second differential amplifier 458. The second differential amplifier output 456 may be connected to the non-inverting input of the second differential amplifier 458. The second differential amplifier output 456 may be connected to a polarity inverter 460. The polarity inverter output 462 may be connected to a first terminal of the second variable resistance R5. A second terminal of the second variable resistance R5 may be connected to the inverting input 406. The second differential amplifier 458, polarity inverter 462 and second variable resistance R5 may compensate for gain and phase error introduced by the passive integrator 426. The inventor of the present disclosure has appreciated that this may result in a simpler circuit arrangement than an active integrator which requires a more complicated amplifier circuit.

An output 432 of the first gain element 430 may be connected to a first input of second differentiator stage 434. A second input of second differentiator stage 434 may be connected to an output 454 of a second gain element 436. An output 438 of the second differentiator stage 434 may be connected to an input of the second integrator 440 which is an active integrator. An output 442 of the second integrator 440 may be connected to an input of a third gain element 444. A third gain element output 446 may be connected to an input of a quantizer 448.

The quantizer output 450 may be connected to an input of the SINC filter 420. The quantizer The SINC filter output 452 may be connected to a second input of the second gain element 436. The SINC filter output 452 may be connected to a first input of the controller 466. A second input 422 of the controller which may be a register interface for updating maximum gain values may be connected to a microprocessor (not shown). In other examples, the maximum gain values may be hardwired in which case the second input 422 may not be required.

In operation, the first differentiator stage including the gain tracker 464 may apply a gain to the difference between the input signal voltage VIN and the analog equivalent of the DAC input value on the second control output 424.

The output of the first differentiator stage including the gain tracker 464 is oversampled and integrated by the first integrator 426. The second differentiator stage 434 outputs the difference between the output of the first integrator 426 and the quantizer output 450 with a gain of factor −2B which is then integrated by the second integrator 440, where B is an arbitrary gain factor value. The output of the second integrator 440 has a gain factor of 1/B applied by third gain element 444 and the output signal from the third gain element 444 is quantised by the quantiser 448 with quantisation error E1. The output of the quantiser is a pulse density modulated (PDM) bitstream which is then supplied to a decimation filter (not shown) and further filtering to generate a digital signal corresponding to the analog input signal. The second differential amplifier 458 and polarity inverter 460 may compensate the phase error due to the passive integrator 426.

The controller 466 may generate a DAC input value on the second control output 424 determined from an output of the SINC filter. The DAC input value is used to control the variable resistances R3' and R4' to generate a current corresponding to the digital DAC input data. The controller 466 may also generate a control signal on the first control output for the gain tracker 464 to alter the gain applied to an input signal on the ADC input 402. The controller may alter the gain using the gain tracker 464 by selecting a value of resistance R1' corresponding to R2'/A where A is the desired gain. The controller may alter the gain using the gain tracker 464 by selecting a value of resistance for R5 of R2/kout2.

An example controller 500 used to determine kout2 is shown in FIG. 6A. Controller 500 which may be used included in the controller 466 has an input 502 connected to a differentiator stage 504. The input 502 is connected to a delay element 518. The delay element output 516 is connected to a second input of a differentiator stage 504. The output 510 of the differentiator stage is connected to a gain element 512 which has a gain of $1/\beta$, where $\alpha$ is the gain of the passive integrator 426. The output 514 of the gain element 512 is connected to a first input of summing stage 506. An output 508 of the summing stage is connected to an input of a second delay element 520. An output 522 of the second delay element 520 is connected to a second input of the summing stage 506. A value of kout which may be determined in a similar way to controller 200 is input to controller 500. The differentiator stage 504 outputs the difference between the value of kout and the previous kout value, denoted koutz. The output of the differentiator stage 504 is multiplied by a gain factor $1/\alpha$ by gain stage 512 and added to the previous value of kout2 by summing stage 506. If the value of kout2 is negative, then controller 466 changes the polarity of the signal for example by controlling polarity inverter 460.

The controller gain control may be implemented as for controller 200 where the desired gain A of the first differentiator stage corresponds to the value of Kout controller 200. The maximum gain value may be provided to the controller 466 via the register interface 422 and stored in a register (not shown) in the controller 466. The controller 466 may also control the gain of the first gain element by a factor of B/A. By varying the gain of the first gain element 430 by a factor of B/A, the same signal and noise transfer function is maintained regardless of the gain of the first differentiator stage. The second gain element 436 may have a gain factor of −2 B. The third gain element 444 may have a factor of 1/B.

Embodiments of the Sigma-Delta ADC described herein may achieve high dynamic range which may for example be greater than 100 dB with only one programmable gain stage and using a single ADC. The feedback connection directly to a programmable gain input of a gain tracker may allow higher swing without saturation and may also save power. Furthermore, no digital control is required to set the gain. Example of the Sigma-Delta ADC described may be included in audio systems, base-band and RF circuits.

A Sigma-Delta analog to digital converter (ADC) is described. The Sigma-Delta ADC includes a series arrangement of a gain tracker, a first discrete-time integrator stage and a quantizer between an ADC input and an ADC output. The Sigma-Delta ADC includes a digital to analog converter (DAC) having a DAC input and a DAC output connected to the gain tracker. The Sigma-Delta analog to digital converter includes a controller having a control input connected to the quantizer output. The controller provides a digital input to the DAC input provides a gain control signal to the gain tracker.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A Sigma-Delta analog to digital converter, ADC, comprising:
    a series arrangement of a first differentiator stage comprising a gain tracker, a first discrete-time integrator stage and a quantizer between an ADC input and an ADC output;
    a digital to analog converter, DAC, having a DAC input and a DAC output connected to the gain tracker; and
    a controller having a control input coupled to the quantizer output; wherein the controller is configured to provide a digital input to the DAC input and to provide a gain control signal to the gain tracker and wherein the gain tracker is configured to apply a gain determined by the gain control output to a signal corresponding to a difference between a received signal on the analog input and the quantizer output.

2. The Sigma-Delta ADC of claim 1 wherein the gain tracker further comprises
    a differential amplifier having a first differential amplifier input coupled to the ADC input, a second differential amplifier input configured to be coupled to a supply voltage, and a differential amplifier output; and configured to amplify the difference of the analog input signal and the ADC output signal;
    wherein the DAC output is connected to the first differential amplifier input.

3. The Sigma-Delta ADC of claim 1 wherein the DAC comprises a programmable current source.

4. The Sigma-Delta ADC of claim 1 wherein the DAC comprises:
    a first DAC variable resistance arranged between a reference voltage terminal and the DAC output;
    a second DAC variable resistance arranged between a ground reference terminal and the DAC output;
    wherein the first variable resistance and second variable resistance are coupled to the DAC data output.

5. The Sigma-Delta ADC of claim 2 wherein the gain tracker circuit further comprises a first gain tracking resistance arranged between the ADC input and the first differential amplifier input and a second gain tracking resistance arranged between the differential amplifier output and the first differential amplifier input and wherein at least one of the first gain tracking resistance and the second gain tracking resistance is a variable resistance and is coupled to the gain control output.

6. The Sigma-Delta ADC of claim 1 further comprising a sinc filter arranged between the ADC output and the controller wherein the sinc filter is configured to scale the output to a predetermined number of levels.

7. The Sigma-Delta ADC of claim 6 wherein the controller is configured to determine the gain value on the gain output by comparing the magnitude of the scaled output of the sinc filter with a predetermined threshold for a predetermined time.

8. The Sigma-Delta ADC of claim 6 wherein the first integrator stage is a passive integrator and the ADC further comprises a phase corrector arranged between the output of the integrator and the first differential input and wherein the gain control output is coupled to the phase corrector.

9. The Sigma-Delta ADC of claim 8 wherein the gain tracking circuit comprises a variable phase corrector resistance arranged between the phase corrector output and the first differential input wherein the gain control output is coupled to the phase corrector resistance.

10. The Sigma-Delta ADC of claim 9 wherein the controller is configured to determine a first gain control value on the gain output by comparing the magnitude of the scaled output of the sinc filter with a predetermined threshold for a predetermined time and to determine a second gain control value from the first gain value and the gain of the passive integrator and wherein the first gain value is used to control the first gain tracking resistance and the second gain control value is used to control the phase corrector resistance.

11. The Sigma-Delta ADC of claim 1 further comprising a series arrangement of a second differentiator stage and second integrator coupled between the first integrator output and the quantizer input, wherein the quantizer output is coupled to a first input of the second differentiator stage.

12. The Sigma-Delta ADC of claim 11 further comprising a first gain stage arranged between the first integrator output and a second input of the second differentiator stage, a second gain stage arranged between the second integrator output and a first input of the second differentiator stage, a third gain stage arranged between the quantizer output and the first input of the differentiator stage.

13. The Sigma-Delta ADC of claim 12 wherein the gain control output is coupled to the first gain stage.

14. The Sigma-Delta ADC of claim 13 wherein the first gain stage has a gain factor of B/A, the second gain stage has a gain factor of 1/B and the third gain stage has a gain factor of −2/B wherein A is the variable gain of the first differentiator stage.

15. An audio amplifier comprising the Sigma-Delta ADC of claim 1.

* * * * *